United States Patent
Iinuma et al.

(10) Patent No.: US 7,495,293 B2
(45) Date of Patent: Feb. 24, 2009

(54) SEMICONDUCTOR DEVICE AND METHOD FOR MANUFACTURING THE SAME

(75) Inventors: Toshihiko Iinuma, Yokohama (JP); Haruko Akutsu, Yokohama (JP); Kyoichi Suguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 128 days.

(21) Appl. No.: 11/512,187

(22) Filed: Aug. 30, 2006

(65) Prior Publication Data

US 2007/0052039 A1 Mar. 8, 2007

(30) Foreign Application Priority Data

Aug. 31, 2005 (JP) .............................. 2005-252359

(51) Int. Cl.
*H01L 27/088* (2006.01)
*H01L 21/28* (2006.01)

(52) U.S. Cl. .................................................. 257/384

(58) Field of Classification Search ......... 257/381–385, 257/388, 413, 455, 456, 576, 754–757, 768, 257/377, 412

See application file for complete search history.

(56) References Cited

U.S. PATENT DOCUMENTS

| 5,168,332 A * | 12/1992 | Kunishima et al. .......... 257/385 |
| 2006/0038229 A1* | 2/2006 | Tsuchiya et al. ............ 257/351 |
| 2006/0208320 A1* | 9/2006 | Tsuchiya et al. ............ 257/371 |

FOREIGN PATENT DOCUMENTS

| JP | 2005-209782 | 8/2005 |
| JP | 2006-060045 | 3/2006 |

OTHER PUBLICATIONS

Kittl et al., "Silicides for 65 nm CMOS and Beyond," Mat. Res. Soc. Symp. Proc. (2003), 765:267-278.

* cited by examiner

*Primary Examiner*—M. Wilczewski
*Assistant Examiner*—Swapneel Chhaya
(74) *Attorney, Agent, or Firm*—Finnegan, Henderson, Farabow, Garrett & Dunner, L.L.P.

(57) ABSTRACT

A semiconductor device includes a silicon region including Si, and a silicide film provided on the silicon region, the silicide film comprising a compound of Si with Ni, Co, Pd, or Pt and including Er.

12 Claims, 11 Drawing Sheets

SEMICONDUCTOR DEVICE AND METHOD FOR MANUFACTURING THE SAME

CROSS-REFERENCE TO RELATED APPLICATIONS

This application is based upon and claims the benefit of priority from prior Japanese Patent Application No. 2005-252359, filed Aug. 31, 2005, the entire contents of which are incorporated herein by reference.

BACKGROUND OF THE INVENTION

1. Field of the Invention

The present invention relates to a semiconductor device including silicide film and a method for manufacturing the same.

2. Description of the Related Art

A semiconductor device which has been progressed in miniaturization recently, for example, a MOS transistor employs salicide process for reducing parasitic resistance of the device. The salicide process is a process for forming the silicide films on source/drain regions and polysilicon gate electrode in self-align manner.

A nickel silicide film is know as one of the silicide film ("Silicide for 65 nm CMOS and beyond" written by Kittl, J. A.;Lauwers, A.;Charmirian, O.;Van Dal, M.;Akheyar, A.;Richard, O.;Lisoni, J. G.;De Potter, M.;Lindsay, R.;Maex, K. CMOS Front-End Materials and Process Technology. Symposium (Mater. Res. Soc. Symposium Proceedings Vol. 765) (USA) xi+308 P.P. 267-78). In the normal salicide process using the nickel silicide film, nickel monosilicide (NiSi) films are formed on the source/drain regions.

The NiSi films formed on the source/drain regions reduce contact resistance between the source/drain regions and source/drain electrode.

However, an interface between the source/drain regions and the NiSi films is not flat, so there is possibility that junction leakage current is not reduced by the NiSi films if the miniaturization further progresses (Lg<50 nm) hereafter.

BRIEF SUMMARY OF THE INVENTION

According to an aspect of the present invention, there is provided a semiconductor device comprising: a silicon region including Si; and a silicide film provided on the silicon region, the silicide film comprising a compound of Si with Ni, Co, Pd, or Pt and including Er.

According to another aspect of the present invention, there is provided a method for manufacturing a semiconductor device comprising: forming a metal film comprising Ni, Co, Pd, or Pt and including Er on a silicon region including Si; forming a cap film on the metal film for suppressing the Er from being oxidized; and forming a silicide film comprising a compound of Si with Ni, Co, Pd, or Pt and including Er by heating the silicon region and the metal film.

DETAILED DESCRIPTION OF THE INVENTION

Embodiments of the present invention will be described below with reference to the drawings.

First Embodiment

FIGS. 1 to 6 are sectional views showing a method for manufacturing a semiconductor device in accordance with a first embodiment.

Figure 1:
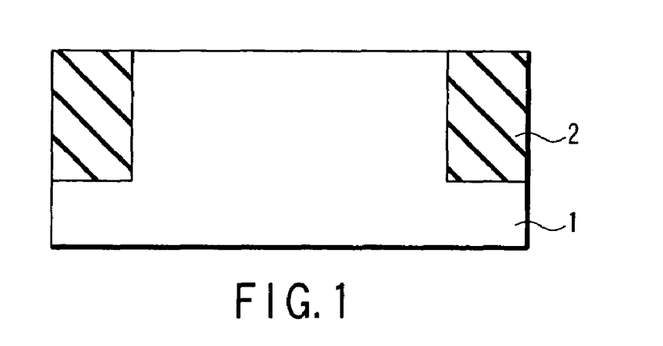
FIG. 1 is a sectional view showing a method for manufacturing a MOS transistor in accordance with a first embodiment.

[FIG. 1]

An isolation region 2 is formed on a surface of a silicon substrate. The isolation region 2 is formed by STI (Shallow Trench Isolation) process for instance.

Figure 2:
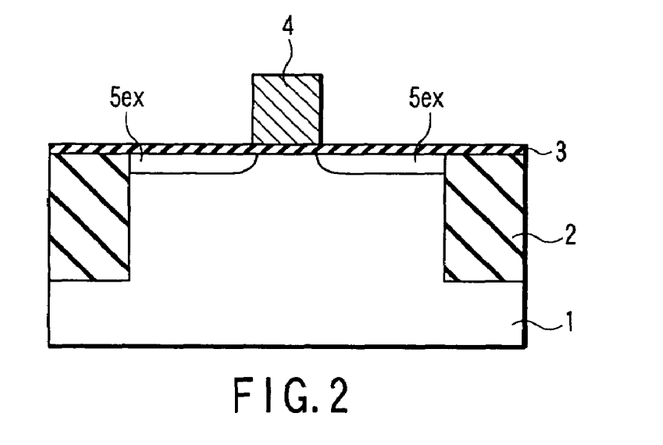
FIG. 2 is a sectional view continued from FIG. 1 and showing the method for manufacturing the MOS transistor in accordance with the first embodiment.

[FIG. 2]

A gate insulating film is formed on the silicon substrate 1. A gate electrode comprising polycrystalline silicon film is formed on the gate insulating film 3. Impurities (for example, arsenic ion in a case of n channel) are implanted into the surface of the silicon substrate 1 by ion implantation using the gate electrode as mask, further, the impurities are activated by RTA (Rapid Thermal Anneal) process, thereby, extension regions 5ex of source/drain are formed. The activation of the impurities of the extension regions 5ex of source/drain may be carried out by process such as RTA.

Figure 3:
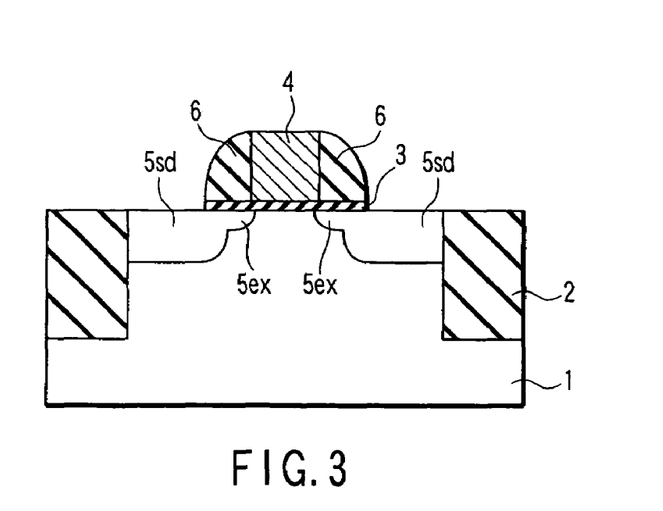
FIG. 3 is a sectional view continued from FIG. 2 and showing the method for manufacturing the MOS transistor in accordance with the first embodiment.

[FIG. 3]

A silicon nitride film is deposited on the entire surface, the silicon nitride film is etched by RIE (Reactive Ion Etching) process, thereby, a spacer 6 comprising the silicon nitride film is formed on the sidewall of the gate electrode 4.

Impurities are implanted into the surface of the silicon substrate 1 using the spacer 6 and the gate electrode 4 as a mask, further, the impurities are activated by process such as RTA, thereby, source/drain regions 5sd are formed.

Figure 4:
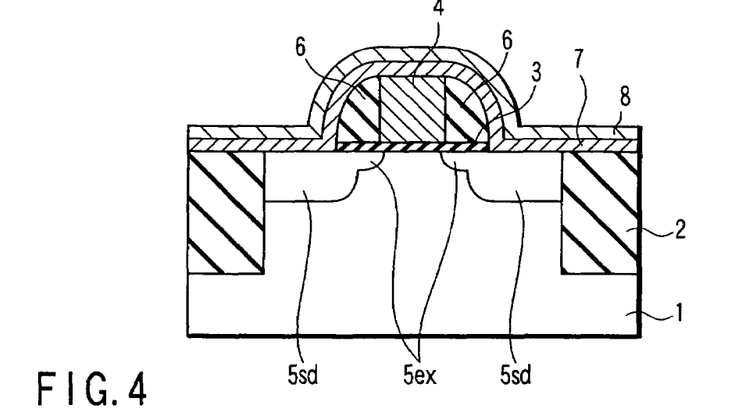
FIG. 4 is a sectional view continued from FIG. 3 and showing the method for manufacturing the MOS transistor in accordance with the first embodiment.

[FIG. 4]

A nickel film (Er-Ni film) 7 including an erbium (Er) is formed on the entire surface. The Er-Ni film 7 is formed by sputter process for instance. At this time, two targets of Er target and Ni target may be used, or one target including Er and Ni may be used. In a case where the two targets are used, the Er target and the Ni target may be sputtered alternately, or the Er target and the Ni target may be sputtered at the same time.

A tungsten film (W film) 8 is formed on the Er-Ni film 7. The W film 8 has a function of cap film for suppressing oxidation of Er in the Er-Ni film 7.

The oxidation of Er is generated between taking the substrate out of a sputter apparatus for forming the Er-Ni film 7 and carrying the substrate into an RTA apparatus for silicidation.

If the Er is oxidized, the effect of the present embodiment (flatness of the interface) to be mentioned later decreases.

Therefore, the W film 8 (cap film) is important to sufficiently suppress the oxidation of Er in the Er-Ni film 7.

However, if the oxidation of Er during the manufacturing is suppressed, the W film 8 (cap film) is not necessarily needed.

A native oxide film is formed on the gate electrode 4 or the source/drain region 5sd when the Er-Ni film 7 is formed. Even if the native oxide film is completely removed using dilute hydrofluoric acid or the like as a pretreatment, a native oxide film is grown because the substrate is exposed to the air between the pretreatment is finished and the substrate is introduced into the spatter apparatus. This native oxide film generally disturbs the silicide reaction. However, in the present embodiment, this native oxide film can be sufficiently reduced by Er in the Er-Ni film 7, then, the silicide reaction is not disturbed. In generally, the native oxide film grown on the silicon is 1 nm or less, the Er-Ni film 7 can be sufficiently reduced by setting the Er concentrations of the Er-Ni film 7 at 1% or more when the thickness of the Er-Ni film 7 is about 30 nm for instance.

Figure 5:
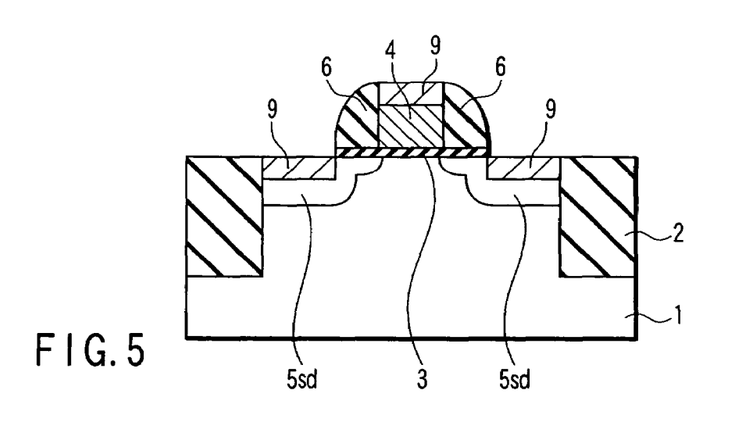
FIG. 5 is a sectional view continued from FIG. 4 and showing the method for manufacturing the MOS transistor in accordance with the first embodiment.

[FIG. 5]

The silicon of the gate electrode 4 and the Er-Ni film 7, the silicon of source/drain regions 5sd and the Er-Ni film 7 are respectively reacted by heat treatment such as RTA, thereby, a nickel silicide film 9. The nickel silicide film 9 is epitaxially grown.

In the present embodiment, progress of the forming of the nickel silicide film 9 is thought as follows. In initial process of the step of FIG. 4, the native oxide film on the Si region is reduced by Er in the Er-Ni film 7, then, a $Er_xSi_yO_z$ film is formed. Thereafter, as Ni in the Er-Ni film 7 diffuses into the si region via the $Er_xSi_yO_z$ film, thereby, supply of Ni into the si region is more restricted compared to a case where no $Er_xSi_yO_z$ film of the interface exists. Therefore, the supply of Ni to a region where reaction of Ni and Si occurs lacks overwhelmingly compared to the supply of Si to the region, then, Ni directly changes into a crystal structure of nickel disilicide ($NiSi_2$). As the nickel disilicide crystal has a crystal structure and lattice constant which are very close to those of monocrystal silicon, the nickel disilicide epitaxially grows on the monocrystal silicon. The ordinary silicidation reaction of Ni occurs in a condition that each of silicon and nickel is sufficiently supplied, then, the ordinary silicidation reaction of Ni proceeds in a sequence "Ni —>$Ni_2Si$ —> NiSi —>$NiSi_2$". The crystal structures of $Ni_2Si$ and NiSi are different from the crystal structure of monocrystal silicon, therefore, the $Ni_2Si$ and NiSi do not epitaxially grow.

In a case of conventional process that the $Er_xSi_yO_z$ film is not formed, a polycrystalline nickel silicide film having NiSi as a main component is formed.

In addition, in a case where the concentrations of Er of the Er-Ni film 7 is set at high concentrations which is higher than 20%, erbium silicide ($ErSi_x$) is formed besides the nickel silicide ($NiSi_2$), thereby, resistivity of the silicide film considerably increases. Therefore, it is better to set the Er concentration of Er-Ni film 7 at 20% or less.

Thereafter, the W film 8 and unreacted Er-Ni film 7 are removed by mixture solution of sulfuric acid and hydrogen peroxide solution for instance.

Figure 6:
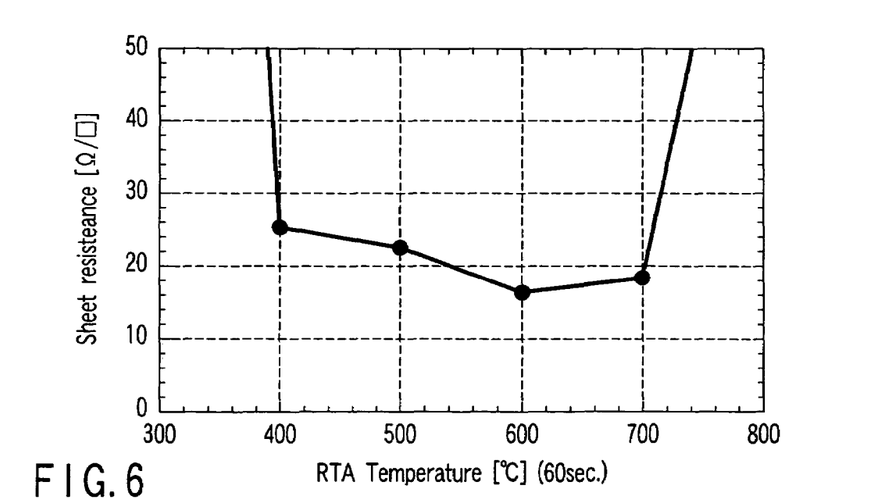
FIG. 6 is a diagram showing the relationship between temperature of heat treatment for silicidation and sheet resistance.

The heating treatment for the silicidation is performed in a range of 400-700° C. for instance. The reason is, as shown in FIG. 6, silicide reaction does not sufficiently proceed under 400° C., and the resistivity of the silicide film can not be lowered because the silicide film becomes discontinuous film by cohesion of film. From FIG. 6, it is understood that the sheet resistance becomes minimum in the vicinity of 600° C.

Figure 7:
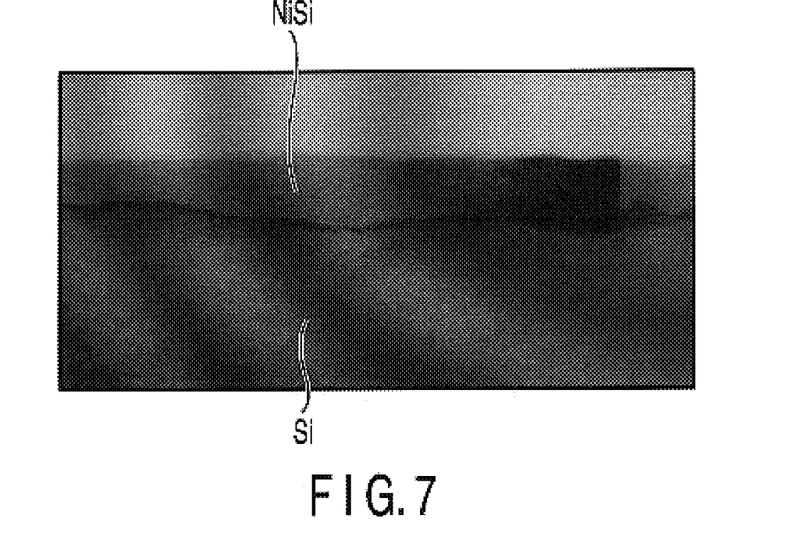
FIG. 7 is transmission electron microphotography (TEM) showing a structure of nickel silicide film formed by conventional process.
Figure 8:
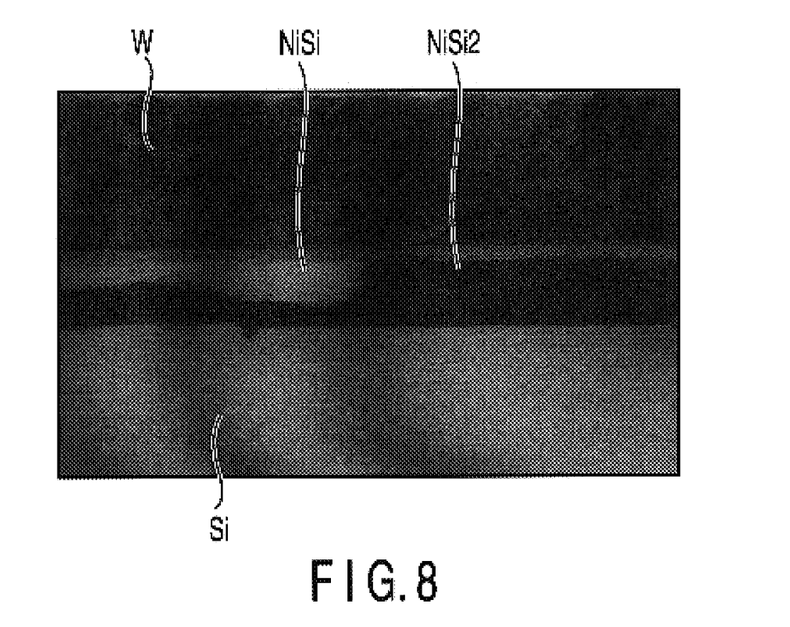
FIG. 8 is microphotography showing a structure of nickel silicide film formed by process of embodiment.

FIGS. 7 and 8 are respectively sectional TEM microphotography of nickel silicide film formed by conventional technology and technology of the present embodiment. As shown in FIG. 7, when the nickel silicide film is formed by conventional nickel silicide process, flatness of an interface between the silicide film and the silicon substrate is low. To the contrary, as shown in FIG. 8, when the silicide film is formed by process of the present embodiment, flatness of an interface between the silicide film and the silicon substrate is very high. As the result of composition analysis by EDX analysis to those silicide films, it is confirmed that the nickel silicide film shown in FIG. 7 according to the conventional technology is a nickel monosilicide (NiSi) film in which the ratio of Ni:Si is 1:1, and the nickel silicide film shown in FIG. 8 according to the present embodiment includes a nickel disilicide ($NiSi_2$) film as a main component in which the ratio of Ni:Si is 1:2, and monosilicide (NiSi) is remained on a part of the film. As this NiSi film has lower resistance than the $NiSi_2$ film, it is effective to remain a nickel monosilicide region on an upper part of the silicide film in such a shape for reducing the resistivity of the film. In addition, it is possible to completely change this nickel monosilicide into an epitaxial region of nickel disilicide by performing heating process for silicidation at high temperature, or adding a high temperature heat process after removing the W film and unreacted Ni-Er film by chemical solution treatment such as sulfuric acid water mixture.

Further, it is found that the process of the embodiment suppresses cohesion of the nickel silicide film.

After the FIG. 5, it is followed by well-known steps of such as a wiring (gate wiring, source/drain regions wirings) process or the like, then the MOS transistor is accomplished.

When the MOS transistor obtained by the process of the present embodiment is evaluated, it is confirmed that junction leakage current of source/drain region is suppressed. One reason for the suppressing the leakage current comparing to the conventional nickel silicide technology is the flatness of the interface between the silicon substrate 1 and nickel silicide film. The other reason is considered as follows. The suppression of Er diffusion into the silicon substrate 1 at the time of the silicidation by use of the Er-Ni film 7. The Er diffusion into the silicon substrate 1 makes levels in the silicon substrate 1, which cause the leakage current.

Figure 9:
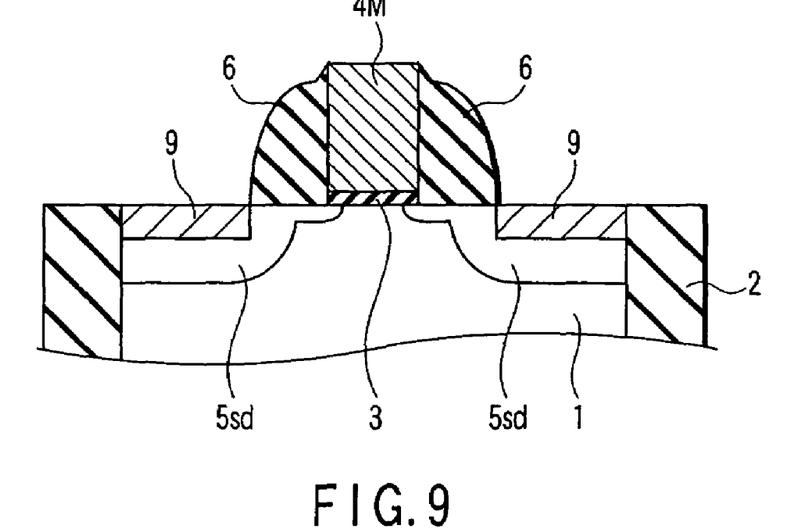
FIG. 9 is a sectional view showing a modified example of the embodiment.
Figure 10:
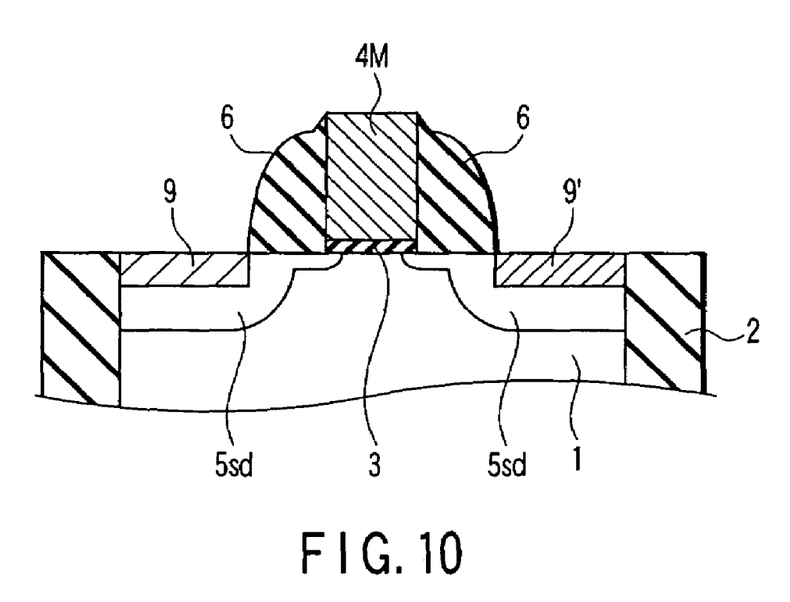
FIG. 10 is a sectional view showing an another modified example of the embodiment.

FIG. 9 and FIG. 10 are sectional views showing modified examples of the embodiment.

The MOS transistor of the modified example in FIG. 9 is different from the present embodiment in that the metal gate electrode is used. The material of the metal gate electrode 4M is TiN, TiAlN, W, WSi, WN, TaN, TaSiN, Ru, $RuO_2$, AlN, Pt, Pd, or Re. The process for the MOS transistor in FIG. 9 is the same as the conventional process except for forming the nickel silicide film 9 using the Er-Ni film 7.

The MOS transistor of the modified example in FIG. 10 is different from the present embodiment in that the metal gate electrode is used, the nickel silicide film (nickel silicide film including Er) 9 is formed on the one source/drain region 5sd, and a silicide film 9' differing from the nickel silicide film 9 is formed on the other source/drain region 5sd. The silicide film 9' is, for example, a nickel silicide film which does not include Er. The process for the MOS transistor in FIG. 9 is the same as the conventional process except for forming the nickel silicide film 9 using the Er-Ni film 7 on the one source/drain region 5sd.

Second Embodiment

FIGS. 11A and 11B to FIGS. 18A and 18B are plane and sectional views showing a method for manufacturing a FINFET in accordance with a second embodiment.

Figure 11A:
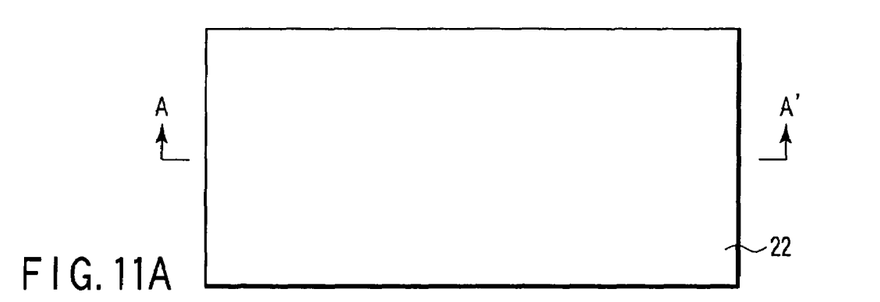
FIGS. 11A and 11B are plan and sectional views showing a method for manufacturing a FINFET in accordance with a second embodiment.
Figure 11B:
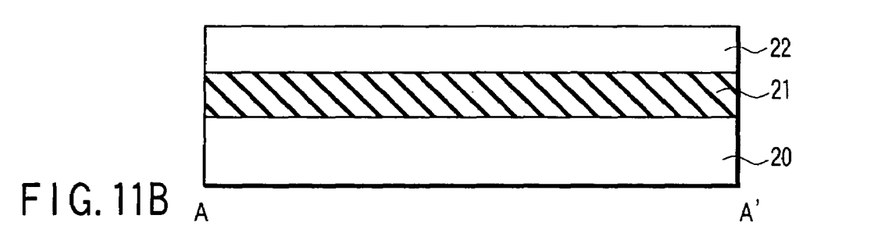

[FIGS. 11A and 11B]

A SOI substrate comprising a silicon substrate 20, a silicon oxide film 21, a silicon layer (SOI layer) which are stacked sequentially is prepared. The SOI substrate may have other structure which is not shown in FIGS. 11A and 11B.

Figure 12A:
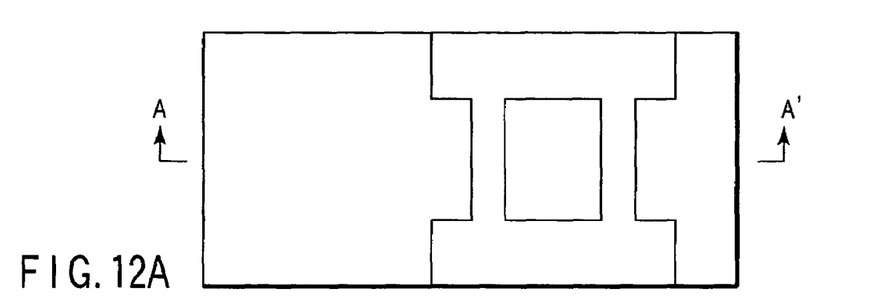
FIGS. 12A and 12B are plan and sectional views continued from FIGS. 12A and 12B and showing the method for manufacturing the FINFET in accordance with the second embodiment.
Figure 12B:
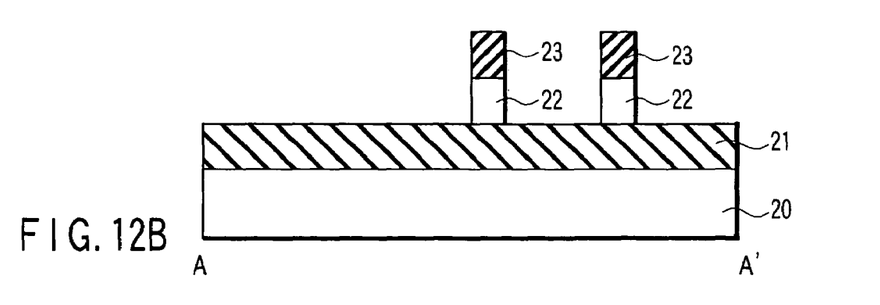

[FIGS. 12A and 12B]

A first hard mask 23 is formed on the SOI layer 22, thereafter, the SOI layer 22 is etched using the hard mask 23 as a mask, thereby, an active region (channel region, source/drain regions) is defined. A gate insulating film not shown is formed by thermal oxidation for instance.

Figure 13A:
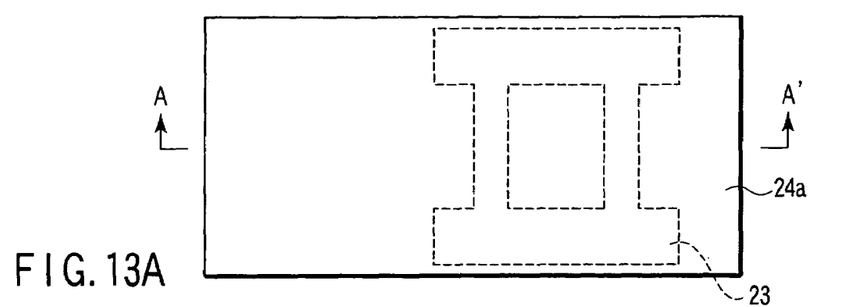
FIGS. 13A and 13B are plan and sectional views continued from FIGS. 12A and 12B and showing the method for manufacturing the FINFET in accordance with the second embodiment.
Figure 13B:
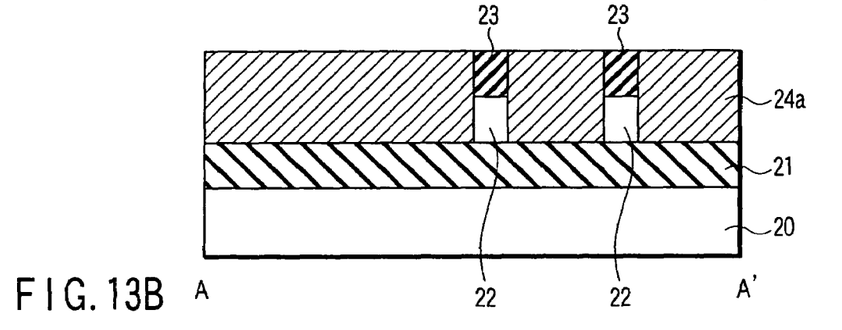

[FIGS. 13A and 13B]

A first polycrystalline film 24a to be a polysilicon gate is formed on the entire surface by CVD process for instance, thereafter, the first polycrystalline film 24a is etched back by CMP process until the first hard mask 23 is exposed. As a result, the region including the first hard mask 23 and the first polycrystalline film 24a is planarized.

Figure 14A:
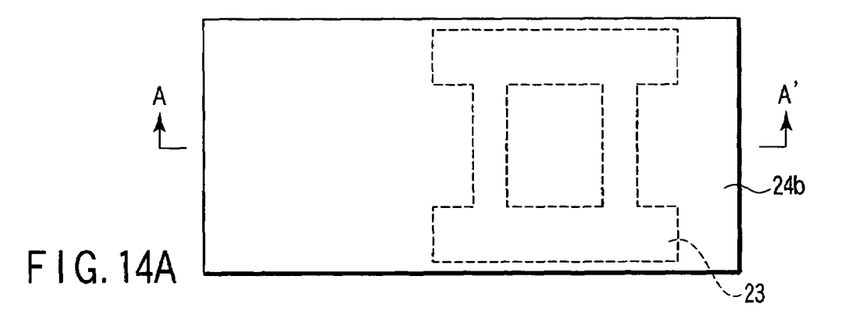
FIGS. 14A and 14B are plan and sectional views continued from FIGS. 13A and 13B and showing the method for manufacturing the FINFET in accordance with the second embodiment.
Figure 14B:
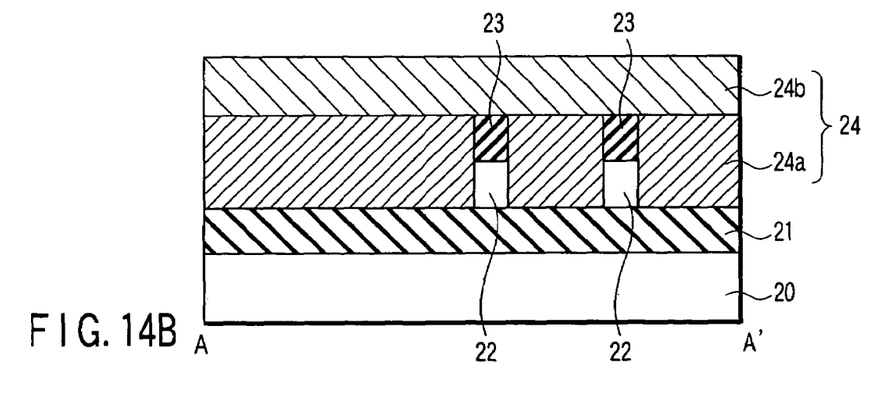

[FIGS. 14A and 14B]

A second polycrystalline film 24b to be the polysilicon gate is formed on the region including the first hard mask 23 and the first polycrystalline film 24a. The first and second polycrystalline films 24a and 24b will be referred to as "polycrystalline film 24" hereinafter.

Figure 15A:
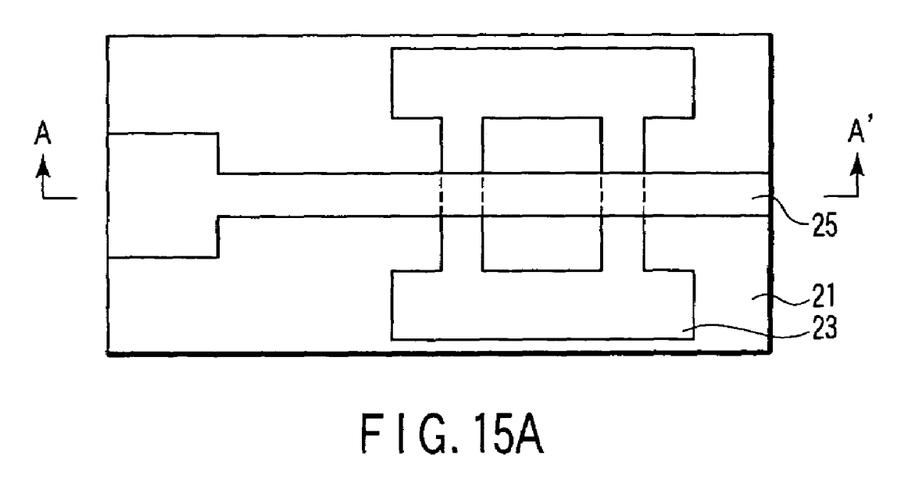
FIGS. 15A and 15B are plan and sectional views continued from FIGS. 14A and 14B and showing the method for manufacturing the FINFET in accordance with the second embodiment.
Figure 15B:
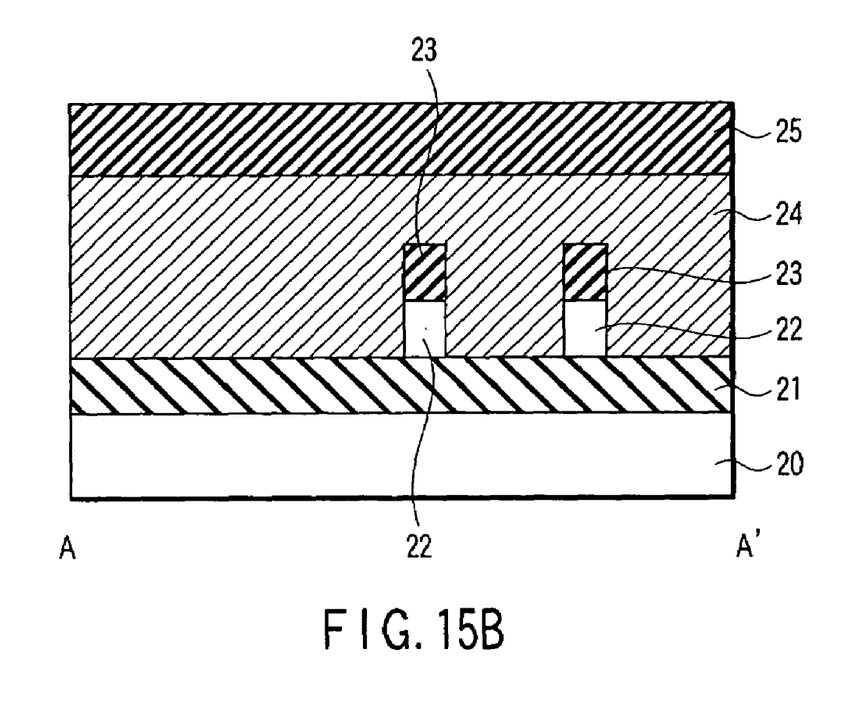

[FIGS. 15A and 15B]

Figure 19:
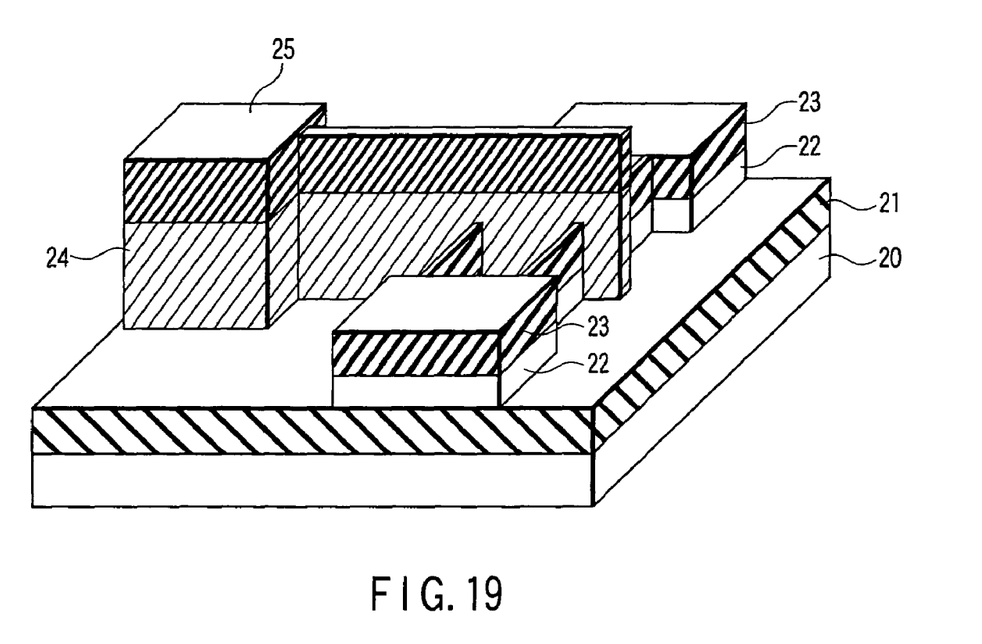
FIG. 19 is perspective view of the FINFET in accordance with the second embodiment in the step of FIGS. 15A and 15B.

A second hard mask 25 for gate processing is formed on the polycrystalline film 24, thereafter, the polycrystalline film 24 is etched using the second hard mask 25 as a mask, thereby, the polysilicon gate 24 is formed. The perspective view of the FINFET in the present step is shown in FIG. 19.

Figure 16A:
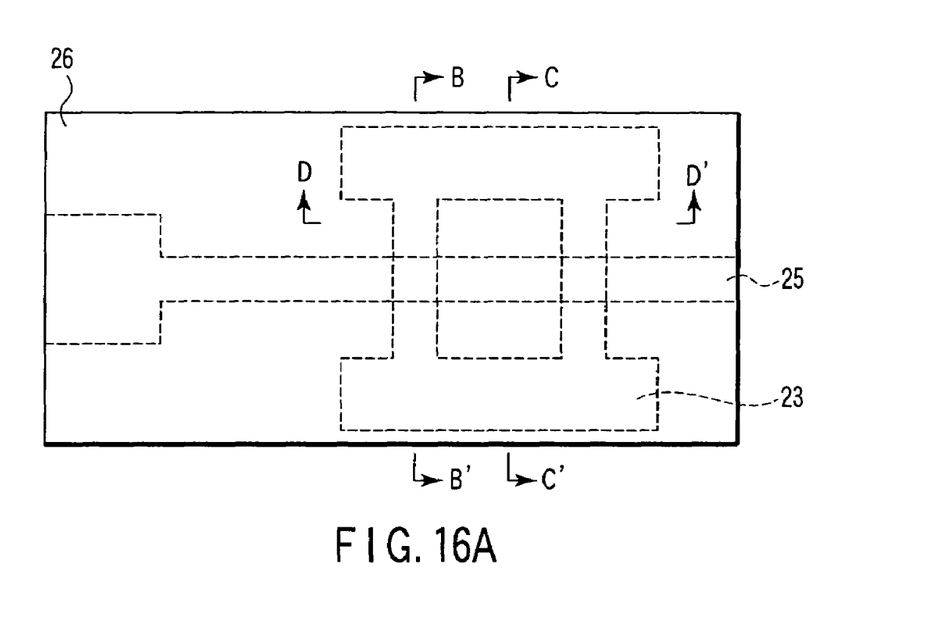
FIGS. 16A and 16B are plan and sectional views continued from FIGS. 15A and 15B and showing the method for manufacturing the FINFET in accordance with the second embodiment.
Figure 16B:
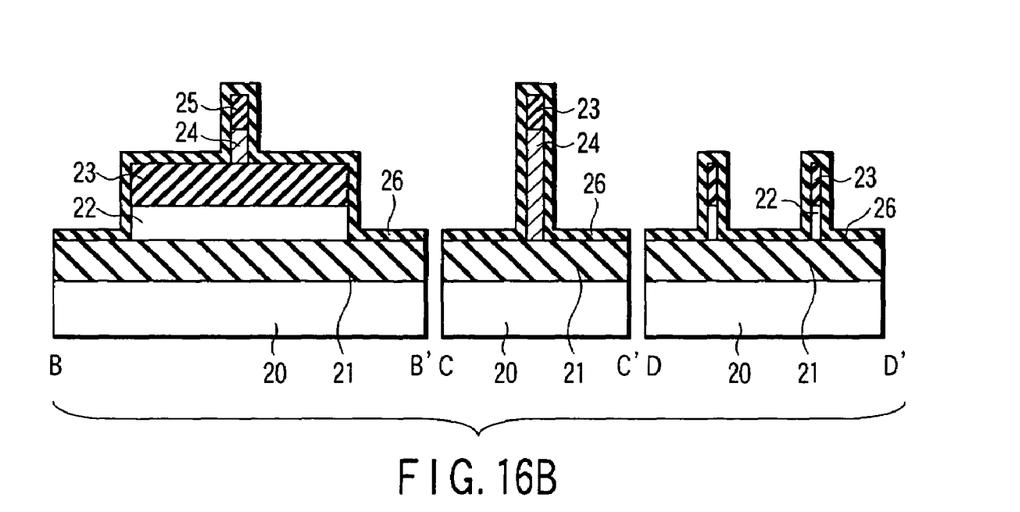

[FIGS. 16A and 16B]

A silicon nitride film 26 to be a spacer is formed on the entire surface.

Figure 17A:
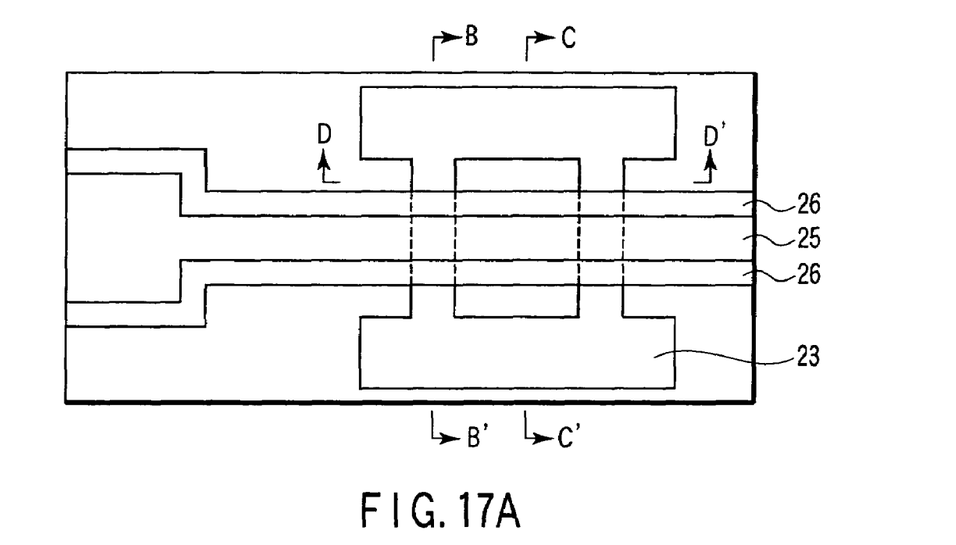
FIGS. 17A and 17B are plan and sectional views continued from FIGS. 16A and 16B and showing the method for manufacturing the FINFET in accordance with the second embodiment.
Figure 17B:
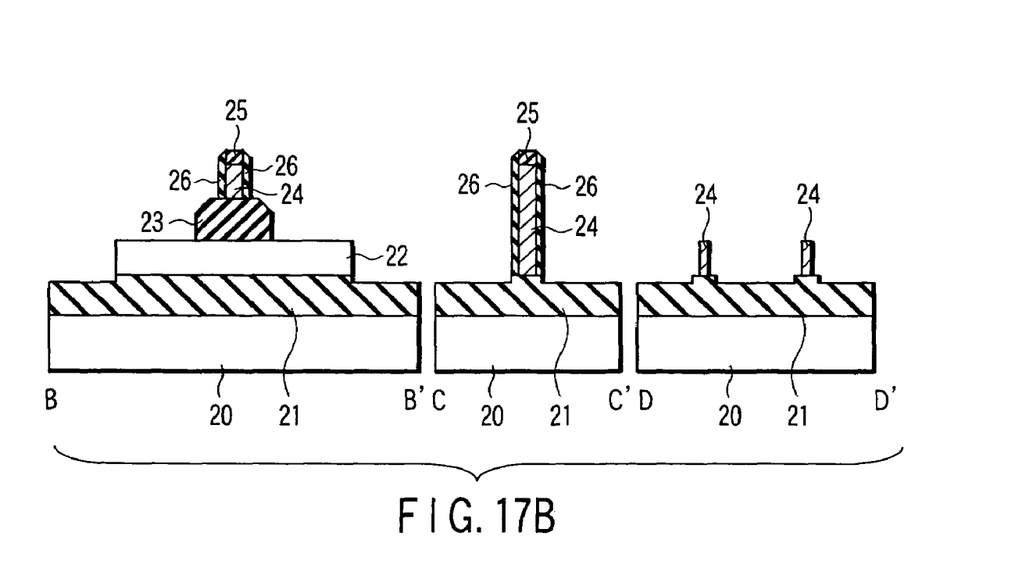

[FIGS. 17A and 17B]

The silicon nitride film 26, the first hard mask 23 are etched by RIE process, thereby, the spacer 26 is formed. At this time, the silicon nitride film 26 of the D-D' cross section of FIG. 17 is removed, thereby, the side surfaces of the SOI layer 22 to be source/drain regions are exposed.

Figure 18A:
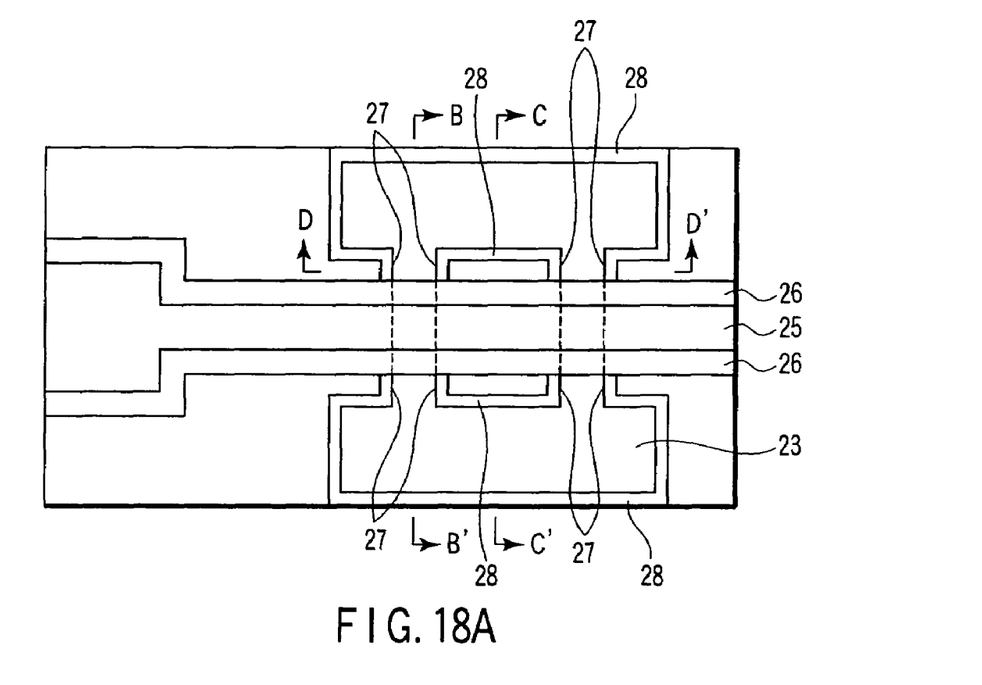
FIGS. 18A and 18B are plan and sectional views continued from FIGS. 17A and 17B and showing the method for manufacturing the FINFET in accordance with the second embodiment.
Figure 18B:
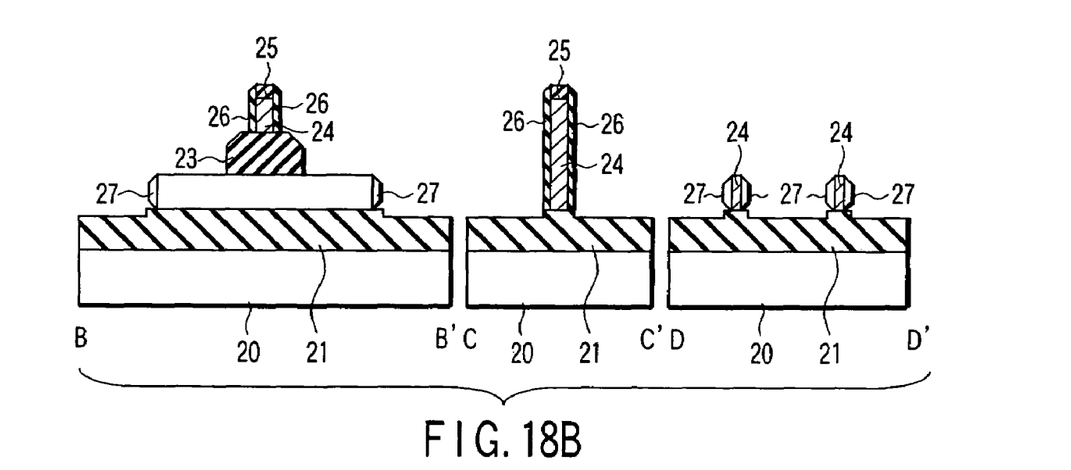

[FIGS. 18A and 18B]

Impurities are implanted into the exposed side surfaces of the SOI layer 22 by tilt ion implantation process for instance, further, the impurities are activated by RTA process, thereby, the source/drain regions are formed on the side surfaces of the SOI layer 22.

In the same manner as the first embodiment, the Er-Ni film is formed on the entire surface, the W film is formed on the Er-Ni film, the source/drain regions 5sd and the Er-Ni film 7 are respectively reacted by heat treatment such as RTA, thereby, a nickel silicide film 28 is formed. The nickel silicide film 28 is epitaxally grown, then, a monocrystal nickel disilicide ($NiSi_2$) film is formed in the present embodiment, too.

Thereafter, the W film and unreacted Er-Ni film is removed by sulfuric acid water mixture for instance.

The heat treatment for silicidation is performed in range of 400-700° C. for instance due to the same reason as the first embodiment.

It is confirmed that the flatness of an interface between the SOI layer 22 and nickel silicide film 28 which are formed by the method of the embodiment is good.

Further, it is found that the process of the embodiment suppresses cohesion of the nickel silicide film. In the FINFET structure as the present embodiment, the source/drain diffusion region is very thin, as a result, thickness of the silicide film to be formed should be thin compared to planar structure of MOSFET, then, the improvement of cohesion resistance is effective for reducing parasitic resistance of the device.

After the FIGS. 18A and 18B, it is followed by well-known steps of such as a wiring (gate wiring, source/drain regions wirings) process or the like, then the FINFET is accomplished.

When the FINFET obtained by the process of the present embodiment is evaluated, it is confirmed that junction leakage current of the source/drain region is suppressed. One reason for the suppressing the leakage current is the flatness of the interface between the SOI layer 22 and nickel silicide film 28. The other reason is the suppression of Er diffusion into the SOI layer 22 at the time of the silicidation by use of the Er-Ni film. The Er diffusion into the SOI layer 22 makes levels in the SOI layer 22, which cause the leakage current.

The present invention is not limited to the above embodiments. For example, Ni is used as a main silicide material of the metal film, however, Co, Pd, or Pt may be used. In this case, a silicide film comprising a compound of Si with Ni, Co, Pd, or Pt and including Er is formed on the Si region.

The silicide film is formed by forming a metal film comprising alloy of Ni, Co, Pd, or Pt and Er on a silicon region including Si, forming a cap film on the metal film for suppressing the Er from being oxidized, and heating the silicon region and the metal film. The silicon region is not limited to source/drain regions, polysilicon gate electrode.

The nickel silicide film (film including $NiSi_2$) of the embodiment is expected to show its effect notably when the thickness of the nickel silicide film is very small (for example, a few atomic layers).

The conventionally used NiSi film is lower in resistance than NiSi2 film. However, the NiSi film having a good flatness of the interface is not formed by conventional process. On the contrary, according to the present embodiment, the $NiSi_2$ film having a good flatness of the interface can be formed. As a result, if the thinning of the nickel silicide film advanced, the resistance of the nickel silicide film determined by inherent resistance of nickel silicide and junction leakage reduction by improvement of the flatness of the interface becomes lower in the present embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a silicon region including Si; and
    a silicide film provided on the silicon region, the silicide film comprising a compound of Si with Ni, Co, Pd, or Pt and wherein the compound further includes Er.

2. The semiconductor device according to claim 1, wherein the silicon region is a source/drain region including silicon, or a source/drain region and gate electrode which are including Er.

3. The semiconductor device according to claim 1, wherein the nickel silicide film includes NiSi2 contacting to the silicon region in a case where the silicide film is nickel silicide film comprising a compound of Ni and Si.

4. The semiconductor device according to claim 2, wherein the silicide film is a nickel silicide film comprising a compound of Ni and Si, the nickel silicide film includes NiSi2 contacting to the silicon region.

5. The semiconductor device according to claim 3, wherein the nickel silicide film includes ErxSiyOz.

6. The semiconductor device according to claim 4, wherein the nickel silicide film includes ErxSiyOz.

7. A method for manufacturing a semiconductor device comprising:
    forming a metal film comprising Ni, Co, Pd, or Pt and including Er on a silicon region including Si;
    forming a cap film on the metal film for suppressing the Er from being oxidized; and
    forming a silicide film comprising a compound of Si with Ni, Co, Pd, or Pt and wherein the compound further includes Er by heating the silicon region and the metal film.

8. The method for manufacturing the semiconductor device according to claim 7, wherein the silicon region and the metal film are heated at not less than 400° C. and not higher than 700° C. in the forming the silicide film including the Er in a case where the meta film comprises the Ni and includes Er.

9. The method for manufacturing the semiconductor device according to claim 7, wherein Er density of the metal film is 1- 20%.

10. The method for manufacturing the semiconductor device according to claim 7, wherein the cap film includes tungsten.

11. The method for manufacturing the semiconductor device according to claim 7, wherein the silicide film is a nickel silicide film comprising a compound of Ni and Si, the nickel silicide film includes NiSi2 or ErxSiyOz.

12. The method for manufacturing the semiconductor device according to claim 11, wherein the silicide film comprises ErxSiyOz.

* * * * *

UNITED STATES PATENT AND TRADEMARK OFFICE
CERTIFICATE OF CORRECTION

PATENT NO. : 7,495,293 B2
APPLICATION NO. : 11/512187
DATED : February 24, 2009
INVENTOR(S) : Iinuma et al.

Page 1 of 1

It is certified that error appears in the above-identified patent and that said Letters Patent is hereby corrected as shown below:

Claim 3, column 8, line 2, change "NiSi2" to --$NiSi_2$--.

Claim 4, column 8, line 7, change "NiSi2" to --$NiSi_2$--.

Claim 5, column 8, line 10, change "ErxSiyOz." to --$Er_xSi_yO_z$.--.

Claim 6, column 8, line 12, change "ErxSiyOz." to --$Er_xSi_yO_z$.--.

Claim 11, column 8, line 38, change "NiSi2 or ErxSiyOz." to --$NiSi_2$ or $Er_xSi_yO_z$.--.

Claim 12, column 8, line 41, change "ErxSiyOz." to --$Er_xSi_yO_z$.--.

Signed and Sealed this

Seventh Day of April, 2009

JOHN DOLL
*Acting Director of the United States Patent and Trademark Office*